United States Patent
El-Kareh et al.

(10) Patent No.: US 7,144,789 B2
(45) Date of Patent: Dec. 5, 2006

(54) METHOD OF FABRICATING COMPLEMENTARY BIPOLAR TRANSISTORS WITH SIGE BASE REGIONS

(75) Inventors: Badih El-Kareh, Wang (DE); Scott Balster, Munich (DE); Philipp Steinmann, Richardson, TX (US); Thomas Scharnagl, Tiefenbach (DE); Manfred Schiekofer, Freising (DE); Carl Willis, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/822,078

(22) Filed: Apr. 8, 2004

(65) Prior Publication Data

US 2005/0014341 A1    Jan. 20, 2005

(30) Foreign Application Priority Data

Apr. 14, 2003   (DE) ............................... 103 17 096

(51) Int. Cl.
*H01L 21/8222* (2006.01)

(52) U.S. Cl. ...................................... 438/340; 438/309

(58) Field of Classification Search ................ 438/309, 438/312, 313, 316, 322, 325, 340, 341, 357, 438/202–205, 235; 257/197, 511, 525, 565, 257/E27.046, E29.033
See application file for complete search history.

(56) References Cited

U.S. PATENT DOCUMENTS

| 5,930,635 | A   | * | 7/1999  | Bashir et al. ............... 438/313 |
| 6,346,453 | B1  |   | 2/2002  | Kovacic et al. |
| 6,472,288 | B1  | * | 10/2002 | Freeman et al. ............ 438/369 |

* cited by examiner

*Primary Examiner*—David Vu
(74) *Attorney, Agent, or Firm*—Jacqueline J. Garner; W. James Brady, III; Frederick J. Telecky, Jr.

(57) ABSTRACT

In a method of fabricating complementary bipolar transistors with SiGe base regions the base regions of the NPN and PNP transistors are formed one after the other over two collector regions 20, 14 by epitaxial deposition of crystalline silicon-germanium layers 32a, 36a. With this method the germanium profile of the SiGe layers can be freely selected for both NPN and PNP transistors in thus enabling complementary transistor performance to be optimized individually. The SiGe layers 32a, 36a can be doped with an n-type or p-type dopant during or after deposition of the silicon-germanium layers 32a, 36a.

12 Claims, 2 Drawing Sheets

METHOD OF FABRICATING COMPLEMENTARY BIPOLAR TRANSISTORS WITH SIGE BASE REGIONS

FIELD OF THE INVENTION

The invention relates to a method of fabricating complementary bipolar transistors with SiGe base regions in an SiGe—BiCMOS process.

BACKGROUND OF THE INVENTION

Submicron structuring in advanced semiconductor processes achieves a high integration density. Submicron structuring by means of advanced lithographic techniques permits fabrication of greatly scaled down CMOS transistors. The achievable bandwidth and the available driver capacity is, however, restricted in CMOS processes. It is particularly for analog circuits requiring a high cutoff frequency that bipolar transistors are preferably employed, fabricated, for example, from gallium arsenide. Gallium arsenide transistors do not permit integration, however, in conventional CMOS processes. This is why more recently process technologies have been developed comprising fast bipolar transistors combinable with advanced CMOS technologies. One of these technologies is the SiGe—BiCMOS technology in which the base connections of the bipolar transistors are formed by a layer of silicon-germanium (SiGe). By injecting atoms of germanium into the base layers of the SiGe transistors the band gap energy is reduced so that these transistors feature substantially higher cutoff frequencies than transistors fabricated by a conventional bipolar method or BiCMOS method.

Injecting atoms of germanium into the base layers of bipolar transistors is the key to enhanced performance of these transistors. The silicon-germanium base layer is usually deposited by epitaxy.

Complementary transistors are often used in circuitry for implementing specific analog functions. Simultaneous epitaxial growth of the base layers of both transistors (NPN and PNP) does not permit optimizing the germanium profile, however. For as high a cutoff frequency as possible PNP transistors and NPN transistors require differing germanium profiles.

SUMMARY OF THE INVENTION

The invention is thus based on the objective of providing a method with which the base layers of complementary bipolar transistors can be formed with an optimized germanium profile in a simple manner.

This objective is achieved with the inventive method of fabricating complementary bipolar transistors with SiGe base regions by forming on a wafer a first collector region and a second collector region juxtaposed and each comprising an epitaxial layer of silicon and depositing a layer of silicon enhanced with germanium crystalline over each collector region in steps each separate from the other so that crystalline SiGe layers of differing germanium profiles materialize over the collector regions.

This novel method in accordance with the invention now makes it possible to fabricate the base layers for complementary bipolar transistors in SiGe technology by the base layers being formed one after the other so that each complementary bipolar transistor can be fabricated for optimized performance of the base regions.

Advantageous further embodiments of the invention read from the sub-claims.

BRIEF DESCRIPTION OF THE DRAWINGS

The invention will now be detailed with reference to the drawing in which.

DETAILED DESCRIPTION OF THE EMBODIMENTS

Figure 1A:
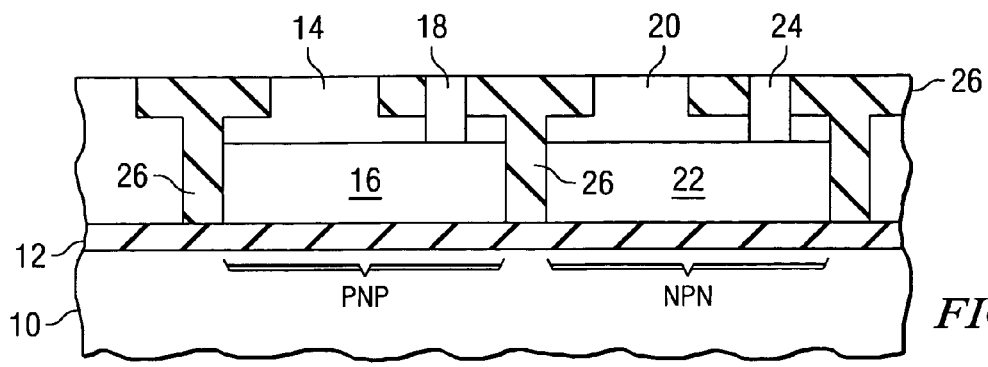
FIGS. 1*a* to 1*f* are section views depicting the steps in the method in accordance with the invention.

Referring now to FIG. 1*a* there is illustrated in a side view a section through a wafer 10 consisting substantially of silicon. Deposited on the wafer 10 are a few structures serving as the starting point for the method in accordance with the invention as detailed in the following. The wafer 10 comprises, running parallel to the top face, a buried layer 12 consisting of silicon dioxide, for example, and used for electrically insulating the overlying layers. Over the buried layer 12 the wafer 10 is provided with two regions formed simultaneously, each of which may form the collector region of a bipolar transistor. In the following the method in accordance with the invention is described for the case that in the left-hand region, termed PNP in FIG. 1*a*, a bipolar PNP transistor is to be formed whilst in the right-hand region termed NPN in FIG. 1*a*, a bipolar NPN transistor is formed.

In the first collector region the collector of an NPN transistor is formed. This region is termed in the following npn collector region 20. The npn collector region 20 consists of an epitaxial crystalline layer of silicon. The npn collector region 20 may be deposited over a so-called buried n-layer 22 interposed between the npn collector region 20 and the layer 12. The buried n-layer 22 consists of silicon doped with a high concentration of n-type dopant (for example arsenic or phosphor). The n-layer 22 serves to make available a low impedance contact to the npn collector region 20. For this purpose, a contact terminal 24 is provided which can produce a microconnection to the top face. The contact terminal 24 substantially consists of silicon doped with a high concentration of n-type dopant.

In the second collector region the collector of a PNP transistor is formed. This collector region is termed pnp collector region 14 in the following. The pnp collector region 14 for the PNP transistor consists of epitaxial crystalline silicon. The pnp collector region 14 may be deposited over a buried p-layer 16 interposed between the pnp collector region 14 and the layer 12. The buried p-layer 16 consists of silicon doped with a high concentration of a p-type dopant (for example boron). The p-layer 16 serves to make available a low impedance contact to the pnp collector region 14. For this purpose a further contact terminal 18 is provided which can produce a microconnection to the top face. The further contact terminal 18 substantially consists of silicon doped with a high concentration of a p-type dopant.

Each of the inactive regions outside of the pnp collector region 14 with the buried p-layer 16 and outside of the npn collector region 20 with the buried n-layer 22 is provided with a trench 26 extending up to the layer 12. This trench 26 is filled with a dielectric such as silicon dioxide, silicon nitride or undoped polycrystalline silicon so that a planar surface is formed on the top face of the wafer.

Figure 1B:
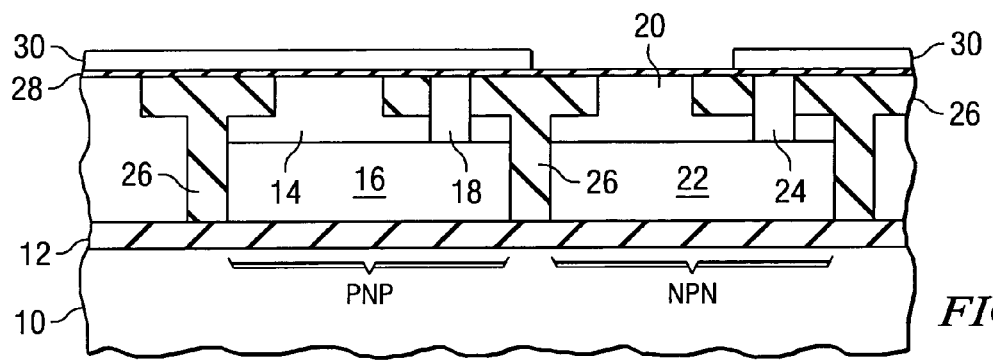

Referring now to FIG. 1*b* there is illustrated how in a first step of the method in accordance with the invention an e.g.

12 nm thick layer of silicon dioxide 28 is deposited on the top face of the wafer 10. Deposited over the layer of silicon dioxide 28 is an e.g. 125 nm thick polycrystalline layer of silicon 30 provided with a photoresist. A first region comprising the npn collector region 20 and a small rim surrounding the npn collector region 20 is released of the polycrystalline layer of silicon 30 by photolithography and e.g. by means of a reactive ion etch technique to expose the layer of silicon dioxide 28, after which, by means of an etching process e.g. wet or dry, the exposed layer of silicon dioxide 28 is removed. The photoresist is subsequently totally removed.

Figure 1C:
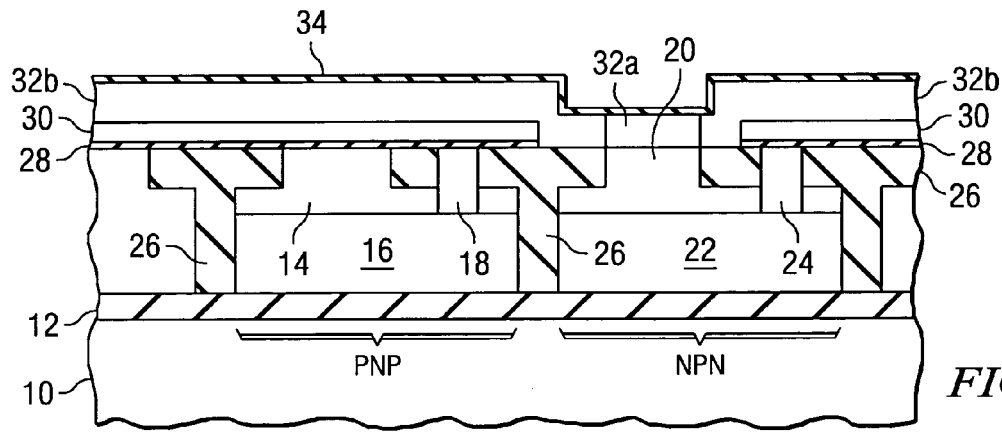

Referring now to FIG. 1c there is illustrated how in the next step an e.g. 190 nm thick epitaxial layer of silicon is deposited on the top face of the wafer 10. During crystalline deposition germanium is added to the silicon and doped with a p-type dopant to thus form over the npn collector region 20 a crystalline layer of SiGe 32a whilst over the polycrystalline layer of silicon 30 a polycrystalline layer of SiGe 32b is formed.

After this, an etch stop 34 is deposited on the top face of the wafer 10, the etch stop 34 consisting of a roughly 30 nm thick layer of silicon dioxide, for example.

Figure 1D:
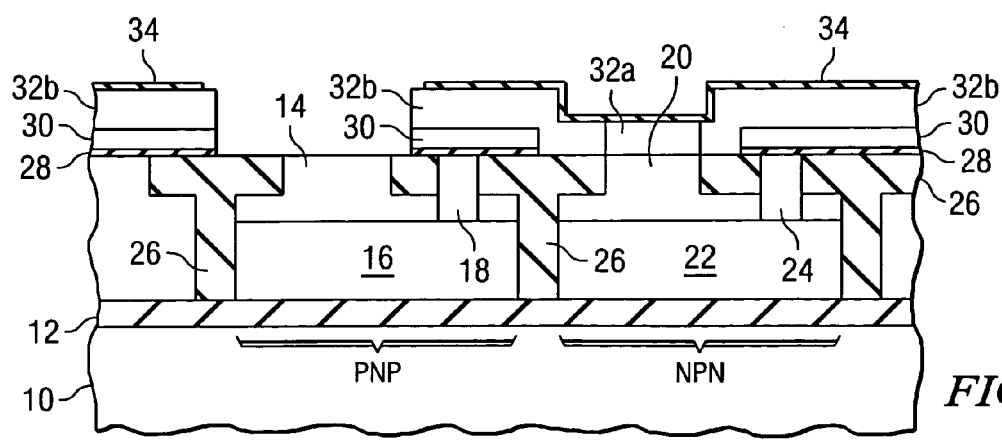

Referring now to FIG. 1d there is illustrated how in the next step a photoresist is deposited on the top face of the wafer 10. A second region comprising the pnp collector region 14 and a small rim surrounding the pnp collector region 14 is released of etch stop 34, the polycrystalline layer of SiGe 32b and polycrystalline layer of silicon 30 by photolithography and by means of an etching technique to expose the layer of silicon dioxide 28, after which the photoresist is totally removed. With an etching process, e.g. wet or dry etching, the layer of silicon dioxide 28 is subsequently removed.

Figure 1E:
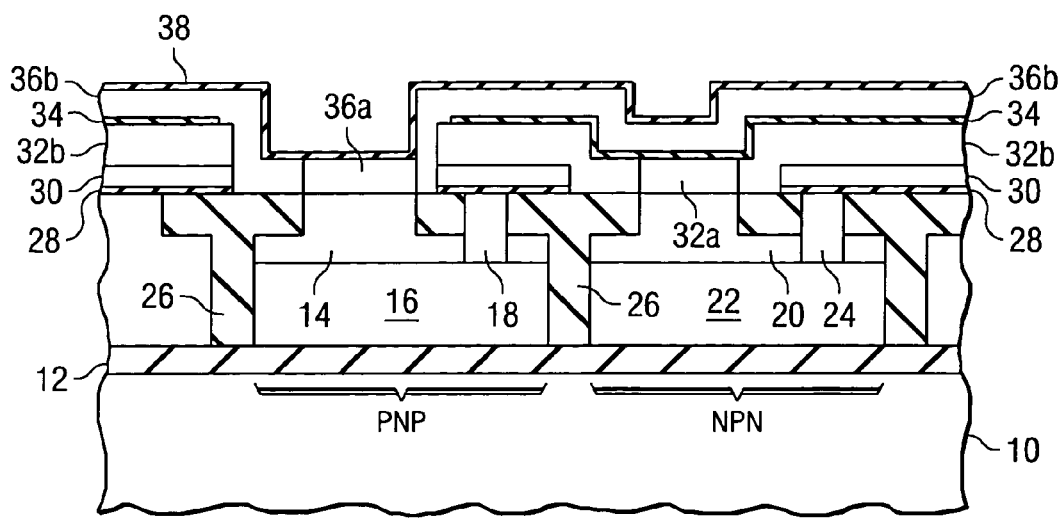

Referring now to FIG. 1e there is illustrated how in the following step a further epitaxial layer of silicon is deposited on the top face of the wafer 10, e.g. 190 nm thick. During crystalline deposition germanium is added to the further layer of silicon and doped with an n-type dopant to thus form over the pnp collector region 14 a further layer of crystalline SiGe 36a, whilst over the polycrystalline layer of silicon 30 a further layer of polycrystalline SiGe 36b is formed.

After this a resist 38 is deposited on the top face of the wafer 10. The resist 38 having a thickness of e.g. 15 nm may consist of silicon dioxide, formed, for example, by decomposition of tetraethylorthosilicate (TEOS).

The further layer of crystalline SiGe 36a and further layer of polycrystalline SiGe 36b may already be doped with an n-type dopant during crystalline deposition, although it is just as possible to implement n-doping, for example with arsenic, not until after crystalline deposition by ion implantation. This may be implemented in several stages so that various regions of the further layer of crystalline SiGe 36a can be doped differingly in thickness to thus permit influencing the doping profile in the further layer of crystalline SiGe 36a.

Figure 1F:
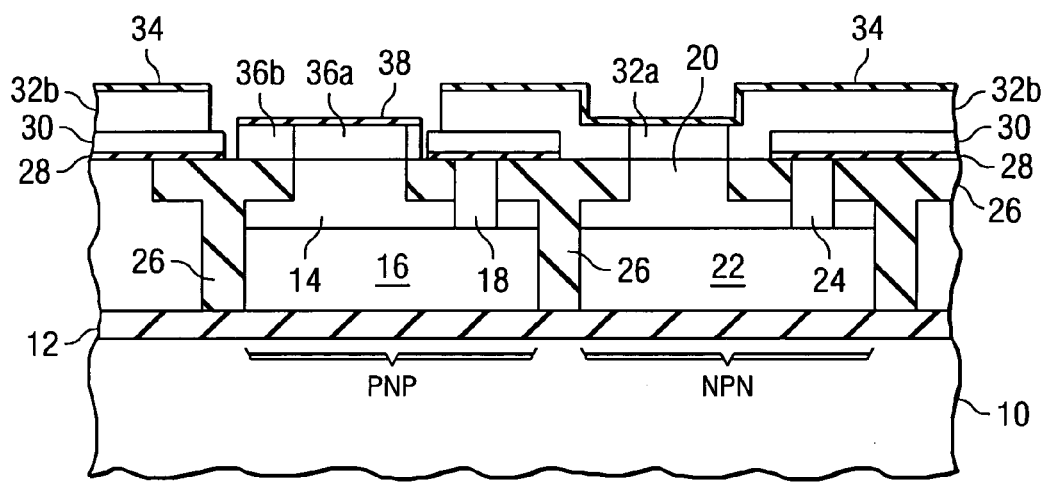

Referring now to FIG. 1f there is illustrated how in the next step with the exception of the surface area over the pnp collector region 14 the resist 38 is totally removed. After this, a photoresist is deposited over the further layer of polycrystalline SiGe 36b and further layer of crystalline SiGe 36a, the photoresist being structured by photolithography. This is followed by the further layer of polycrystalline SiGe 36b, not protected by the photoresist, being removed, leaving the further layer of crystalline SiGe 36a over the pnp collector region 14 in place. By suitably submicron structuring the photoresist surrounding the further layer of crystalline SiGe 36a, the further layer of polycrystalline SiGe 36b is not removed. This remaining region of the further layer of polycrystalline SiGe 36b can be made use of in subsequent steps in processing for contacting the further layer of crystalline SiGe 36a forming the base region of the PNP transistor.

In subsequent steps in processing the etch stop 34 and polycrystalline layer of SiGe 32b can be removed by photolithography and etching, here too, similar to that as already described in the previous paragraph, the polycrystalline layer of SiGe 32b remaining in a microregion surrounding the polycrystalline layer of SiGe 32b for contacting the crystalline layer of SiGe 32a forming the base region of the NPN transistor.

Over the collector regions 20 and 14 the crystalline layers of SiGe 32a and 36a are formed in sequence by the method in accordance with the invention to form the base layers of bipolar transistors. Since the crystalline layers of SiGe 32a and 36a are each produced independently of the other, the profile of the germanium deposited in the silicon layer can be optimized for NPN and PNP transistors. Thus, e.g. the base layer of the PNP transistor may be produced with a trapezoidal germanium profile whilst the base layer of the NPN transistor features a triangular germanium profile. The transistors fabricated by the method in accordance with the invention having optimized germanium profiles of the base layers excel by enhanced performance, such as more particularly elevated cutoff frequencies.

Figure 2:
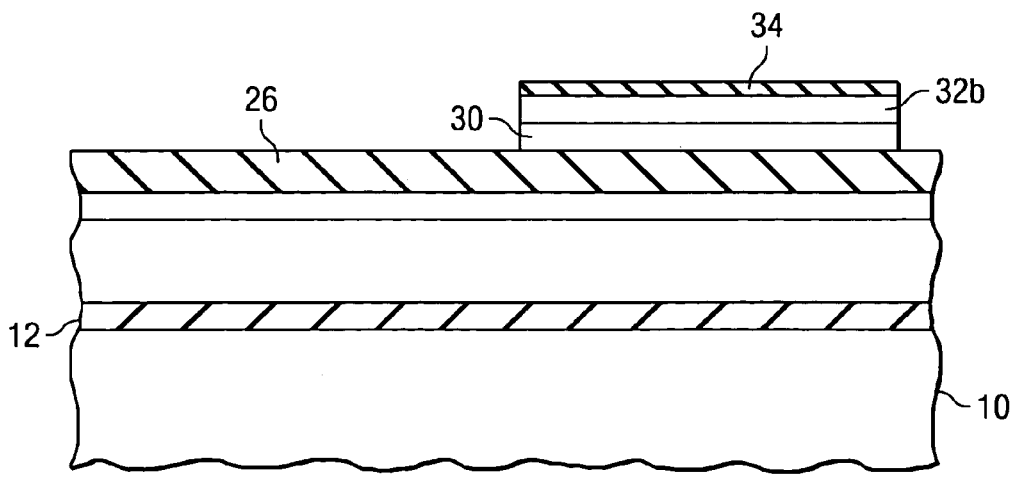
FIG. 2 is a section view through a precision resistor resulting from the method in accordance with the invention.

Applying the etch stop 34 in the method in accordance with the invention also permits fabrication of precision resistors. The polycrystalline layer of SiGe 32b underlying the etch stop 34 remains outside of the p-type collector region 14 during removal of the further layer of polycrystalline SiGe 36b since it is protected by the etch stop 34. Referring now to FIG. 2 there is illustrated a resistor located in a region outside of the active components (NPN and PNP transistors as well as CMOS structures produced by a different method) and formed by an implanted region of the polycrystalline layer of SiGe 32b and polycrystalline layer of silicon 30. The polycrystalline layer of SiGe 32b is covered by the etch stop 34. This layer is also used as a resist during implantation of the precision resistor.

The invention claimed is:

1. A method of fabricating complementary bipolar transistors with SiGe base regions, comprising the steps forming on a wafer a first collector region and a second collector region, each comprising an epitaxial layer of silicon;

and depositing a layer of silicon enhanced with germanium over each collector region in steps each separate from the other so that crystalline SiGe layers of differing germanium profiles materialize over said collector regions, wherein:

prior to a first step of the deposition of the layer of silicon enhanced with germanium over said collector regions, a continuous layer of silicon dioxide is deposited and over said layer of silicon dioxide a polycrystalline layer of silicon is deposited, after which said polycrystalline layer of silicon and said layer of silicon dioxide over said first collector region are removed;

the first step of the deposition of the layer of silicon enhanced with germanium is implemented so that a continuous layer of silicon enhanced with germanium is deposited that comprises a crystalline layer of SiGe formed over the epitaxial layer of silicon in said first collector region and a polycrystalline layer of SiGe formed over said polycrystalline layer of silicon;

after which a continuous etch stop is deposited over said crystalline layer of SiGe and said polycrystalline layer of SiGe;

prior to a second step of the deposition of the layer of silicon enhanced with germanium over said second collector region, portions of said etch stop, said polycrystalline layer of SiGe and said polycrystalline layer of silicon as well as said layer of silicon dioxide are removed from over said second collector region;

the second step of deposition of said layer of silicon enhanced with germanium is implemented so that a continuous further layer of silicon is crystalline deposited, enhanced with germanium so that over said epitaxial layer of silicon in said second collector region said further layer of crystalline SiGe is formed and over said polycrystalline layer of SiGe a further layer of polycrystalline SiGe is formed;

after which a continuous resist is deposited; and then said resist (38) and said further layer of polycrystalline SiGe are totally removed, said further layer of crystalline SiGe remaining over said second collector region.

2. The method as set forth in claim 1 wherein an in-situ doping of said further layer of crystalline SiGe occurs simultaneously with said deposition.

3. The method as set forth in claim 1 wherein doping said further layer of crystalline SiGe after deposition is done by ion implantation.

4. The method as set forth in claim 1 wherein said etch stop and said resist consist of silicon dioxide.

5. The method as set forth in claim 1 wherein in a region of said polycrystalline layer of SiGe outside of said collector regions a resistor is formed by implantation.

6. A method of fabricating complementary bipolar transistors with SiGe base regions, comprising the steps of:

forming a first collector region and a second collector region on a wafer, said first and second collector regions each comprising an epitaxial layer of silicon;

forming a first crystalline layer of SiGe over the first collector region; and forming a second crystalline layer of SiGe over the second collector region such that the second crystalline layer of SiGe has a different germanium profile than the first crystalline layer of SiGe;

prior to the step of forming the first crystalline layer of SiGe, depositing a layer of silicon dioxide and depositing a polycrystalline layer of silicon over the layer of silicon dioxide;

then, removing portions of said polycrystalline layer of silicon and said layer of silicon dioxide over said first collector region;

wherein the first crystalline layer of SiGe is formed by depositing a first continuous layer of silicon enhanced with germanium such that said first crystalline layer of SiGe is formed over the epitaxial layer of silicon in said first collector region and a first polycrystalline layer of SiGe is formed over said polycrystalline layer of silicon; and then, depositing a continuous etch stop over said first crystalline layer of SiGe and said first polycrystalline layer of SiGe.

7. The method as set forth in claim 6, further comprising the steps of:

prior to the step of forming the second crystalline layer of SiGe, removing portions of said etch stop, said first polycrystalline layer of SiGe, said polycrystalline layer of silicon, and said layer of silicon dioxide from over said second collector region;

wherein the second crystalline layer of SiGe is formed by depositing a second continuous layer of silicon enhanced with germanium such that said second layer of crystalline SiGe is formed over the second collector region and a second polycrystalline layer of SiGe is formed over said first polycrystalline layer of SiGe;

after depositing the second layer of silicon enhanced with germanium, depositing a resist; and then, removing said resist and said second layer of polycrystalline SiGe, wherein said second layer of crystalline SiGe remains over said second collector region.

8. The method as set forth in claim 7 wherein said second layer of crystalline SiGe is in-situ doped during deposition.

9. The method as set forth in claim 7, further comprising the step of doping said second layer of crystalline SiGe by ion implantation.

10. The method as set forth in claim 7 wherein said etch stop and said resist comprise silicon dioxide.

11. The method as set forth in claim 7 further comprising the step of forming a resistor by implantation into a region of said first polycrystalline layer of SiGe outside of said first and second collector regions.

12. A method of fabricating complementary bipolar transistors with SiGe base regions, comprising the steps of:

forming a first collector region and a second collector region on a wafer, said first and second collector regions each comprising an epitaxial layer of silicon;

depositing a layer of silicon dioxide and depositing a polycrystalline layer of silicon over the layer of silicon dioxide;

then, removing portions of said polycrystalline layer of silicon and said layer of silicon dioxide over said first collector region;

depositing a first continuous layer of silicon enhanced with germanium such that a first crystalline layer of SiGe is formed over the first collector region and a first polycrystalline layer of SiGe is formed over the polycrystalline layer of silicon;

etching an opening through said first polycrystalline layer of SiGe, said polycrystalline layer of silicon, and said layer of silicon dioxide over said second collector region;

depositing a second continuous layer of silicon enhanced with germanium such that a second layer of crystalline SiGe is formed over the second collector region and a second polycrystalline layer of SiGe is formed over said first polycrystalline layer of SiGe; and then, removing said layer of second polycrystalline SiGe, wherein said second layer of crystalline SiGe remains over said second collector region.

* * * * *